United States Patent
Anand et al.

(10) Patent No.: US 6,995,585 B2
(45) Date of Patent: Feb. 7, 2006

(54) SYSTEM AND METHOD FOR IMPLEMENTING SELF-TIMED DECODED DATA PATHS IN INTEGRATED CIRCUITS

(75) Inventors: Darren L. Anand, Essex Junction, VT (US); John E. Barth, Jr., Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 276 days.

(21) Appl. No.: 10/604,621

(22) Filed: Aug. 5, 2003

(65) Prior Publication Data

US 2005/0030065 A1 Feb. 10, 2005

(51) Int. Cl.
*H03K 19/00* (2006.01)

(52) U.S. Cl. .............................. 326/93; 326/94; 326/21; 326/26

(58) Field of Classification Search ................... 326/17, 326/21, 22, 26–28, 82, 93–94, 105
See application file for complete search history.

(56) References Cited

U.S. PATENT DOCUMENTS

| | | | |
|---|---|---|---|
| 5,648,776 A | 7/1997 | Widmer | 341/100 |
| 5,671,258 A | 9/1997 | Burns et al. | 375/359 |
| 5,748,902 A | 5/1998 | Dalton et al. | 395/200.76 |
| 5,917,364 A | 6/1999 | Nakamura | 327/415 |
| 6,046,943 A | 4/2000 | Walker | 365/189.05 |
| 6,243,779 B1 | 6/2001 | Devanney et al. | 710/129 |
| 6,452,421 B2 * | 9/2002 | Saito | 326/93 |
| 2001/0027504 A1 | 10/2001 | Devanney et al. | 710/129 |
| 2003/0016049 A1 * | 1/2003 | Wei | 326/21 |

FOREIGN PATENT DOCUMENTS

EP WO 00/51014 8/2000

OTHER PUBLICATIONS

K. Nakamura et al.; "SP 24.6: A 500 MHz 4Mb CMOS Pipeline–Burst Cache SRAM with Point–to–Point Noise Reduction Coding I/O" 1997 IEEE International Solid–State Circuits Conference; pp. 406, 407, & 495.

M. Fukaishi et al. "TP 15.7 A 20Gbs CMOS Multi–Channel Transmitter and Receiver Chip Set for Ultra–High Resolution Digital Display;" 2000 IEEE International Solid–State Circuits Conference; pp. 260–261.

K. Nakamura et al.; "A 50% Noise Reduction Interface Using Low–Weight Coding;" 1996 Symposium on VLSI Circuits Digest of Technical Papers; pp. 144–145.

K. Nakamura et al. "A 500–MHz 4–Mb CMOS Pipeline–Burst Cache SRAM with Point–to–Point Noise Reduction Coding I/O;" IEEE Journal of Solid–State Circuits, vol. 32, No. 11, Nov. 1997; pp. 1758–1765.

* cited by examiner

*Primary Examiner*—Anh Q. Tran
(74) *Attorney, Agent, or Firm*—Robert A. Walsh; Cantor Colburn LLP

(57) ABSTRACT

A self-timed data transmission system includes a data bit group defined by at least two data bits to be transmitted from a corresponding plurality of transmitting storage elements. A corresponding plurality of data receiving storage elements receives the data transmitted from said transmitting storage elements. Encoding logic is used for encoding the transmitted data from the transmitting storage elements, wherein the encoded transmitted data is coupled to a plurality of data lines. The encoding logic is further configured so as to result in only one of the plurality of data lines being activated during a given data transmission cycle.

17 Claims, 3 Drawing Sheets

| L5 | L4 | DATA LINE DISCHARGED (CLK = 1) | RECEIVING LATCH OPERATION | |
|---|---|---|---|---|
| 0 | 0 | 308 | SET D5 | SET D4 |
| 0 | 1 | 306 | SET D5 | RESET D4 |
| 1 | 0 | 304 | RESET D5 | SET D4 |
| 1 | 1 | 302 | RESET D5 | RESET D4 |

SYSTEM AND METHOD FOR IMPLEMENTING SELF-TIMED DECODED DATA PATHS IN INTEGRATED CIRCUITS

BACKGROUND OF INVENTION

The present invention relates generally to data transmission paths for integrated circuit devices and, more particularly, to a system and method for implementing self-timed, decoded data paths for input/outputs systems in integrated circuits.

Digital data paths for wide input/output (I/O) circuits and macros in integrated circuit devices typically consume the largest percentage of power within the macro and are often in the critical performance path. This in turn drives a desire to reduce the power consumption of the data path while maintaining the same performance level. In order to properly size power supplies for such wide I/O devices, "worst case" data patterns are assumed. In the context of digital data I/O devices, this worst case is represented by the data for each path changing on each clock cycle, since this results in charging/discharging of the data lines that define each data path.

Relatively speaking, single ended static systems (i.e., those systems in which only the true value of the digital bit, and not the complement thereof, is transmitted on a data line, and which line is not precharged to a defined value) consume the least amount of worst case power for full rail designs, because power is only consumed every other clock cycle. However, with a single ended data bus (either static or dynamic), the latching of the received data is not "self-timed" because the complementary bit is not transmitted to the receiving latch, and thus the data capture is dependent upon a global strobe (i.e., system clock). This is also the case for a single ended dynamic system, where a single true leg is pre-charged to a logic "1" state and discharged only when transmitting a logic "0" state. Self-timing cannot be performed because a transition is not guaranteed on each data bit independent of its state. Other low power data paths utilize small signal swing data lines with local amplification, but again this comes at the expense of performance, complexity and potential noise issues.

On the other hand, dynamic precharge schemes utilize data lines for both the true bit and its complement. In operation, the true/complement data line pairs are pre-charged to a known state, and one is thereafter discharged during data transmission. This configuration offers better performance as a result of the self-timing capability, given that the dual lines provide either a set or a reset signal to the capture latch. Therefore, the time lost in using a global strobe or clock that must satisfy reasonable data setup times to the capture latch is removed. The capture latch will transition to the new data state as soon as the data is available. Conversely, this scheme consumes twice the power of the single ended static system, since one data line always switches during each cycle in the worst case power consumption scenario.

Accordingly, it would be desirable to be able to minimize the power consumption of such data lines while still providing the benefits of self-timing.

SUMMARY OF INVENTION

The foregoing discussed drawbacks and deficiencies of the prior art are overcome or alleviated by a self-timed data transmission system. In an exemplary embodiment, the system includes a data bit group defined by at least two data bits to be transmitted from a corresponding plurality of transmitting storage elements. A corresponding plurality of data receiving storage elements receives the data transmitted from said transmitting storage elements. Encoding logic is used for encoding the transmitted data from the transmitting storage elements, wherein the encoded transmitted data is coupled to a plurality of data lines. The encoding logic is further configured so as to result in only one of the plurality of data lines being activated during a given data transmission cycle.

In another aspect, a self-timed, digital data input/output (I/O) path transmission system includes a data bit group defined by at least two data bits to be transmitted from a corresponding plurality of transmitting latches. A corresponding plurality of data receiving storage latches receives the data transmitted from the transmitting latches. Encoding logic is used for encoding the transmitted data from the transmitting latches, wherein the encoded transmitted data is coupled to a plurality of data lines. In addition, decoding logic is used for decoding the encoded transmitted data on the plurality of data lines, the decoding logic being coupled to the receiving latches. The encoding logic is further configured so as to result in only one of the plurality of data lines being activated during a given data transmission cycle.

In still another aspect, a method for transmitting self-timed data within a multiple input/output (I/O) data path includes configuring the data path into data bit groups defined by at least two data bits to be transmitted from a corresponding plurality of transmitting storage elements. The data to be from the transmitting storage elements is encoded and coupled onto a plurality of data lines, and the data from the plurality of data lines is then decoded. The decoded data is thereafter received by a corresponding plurality of data receiving storage elements. The encoding of the data is implemented in a manner so as to result in only one of the plurality of data lines being activated during a given data transmission cycle.

BRIEF DESCRIPTION OF DRAWINGS

Referring to the exemplary drawings wherein like elements are numbered alike in the several Figures.

DETAILED DESCRIPTION

Disclosed herein is a system and method for implementing self-timed, decoded data paths that consume less power than conventional self-time data path systems. Briefly stated, at least a pair of data bits are "grouped together" through logic encoding and decoding circuitry such that, within a given group, only one line in the group is activated during transmission of the grouped data bit information. As such, the line that activates represents a decoded state for the whole group. In this manner, power consumption is substantially reduced, while still maintaining the high performance of a self-timed data receiving latch.

Figure 1:
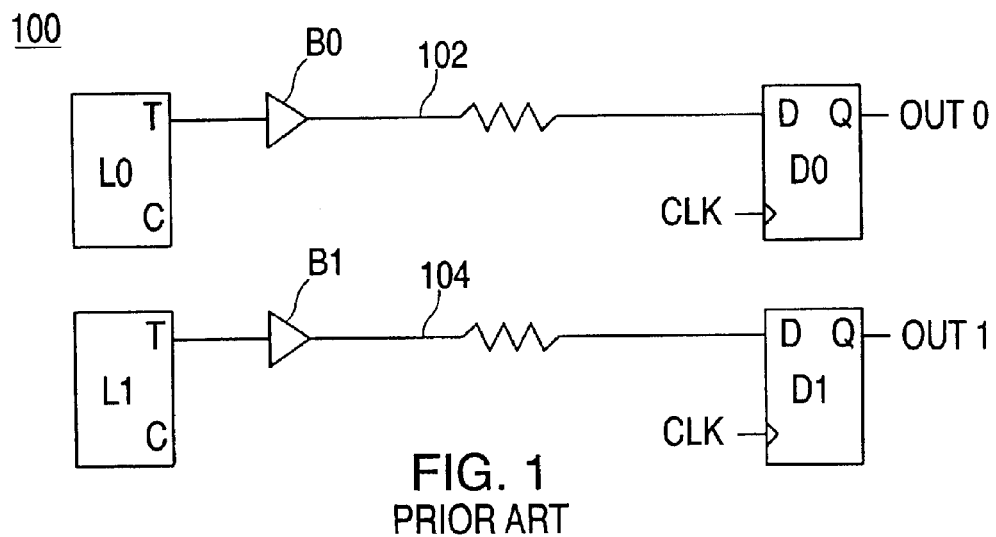
FIG. 1 is a schematic diagram of an existing, single ended, static data bus for a pair of data bits.

Referring initially to FIG. 1, there is shown a schematic diagram of an existing, single ended, static data bus system 100 for a pair of data bits. More specifically, in that of transmitting data latches L0, L1 are coupled to a corresponding pair of data receiving latches, D0, D1, through data lines 102, 104 (as well as buffers B0, B1, respectively). As stated previously, in this single ended configuration, only the true node of each latch L0, L1 is coupled to the input (D) of each data receive latch D0, D1. Accordingly, a clock input (CLK) is used to latch the data to the outputs Out 0, Out 1. The design of a sufficient setup time for the latch clock becomes increasingly problematic with a large number of I/O data paths since longer setup time delays data access. Also, overly aggressive setup times can result in failure to latch the correct data, a problem that self timing completely avoids.

Figure 2:
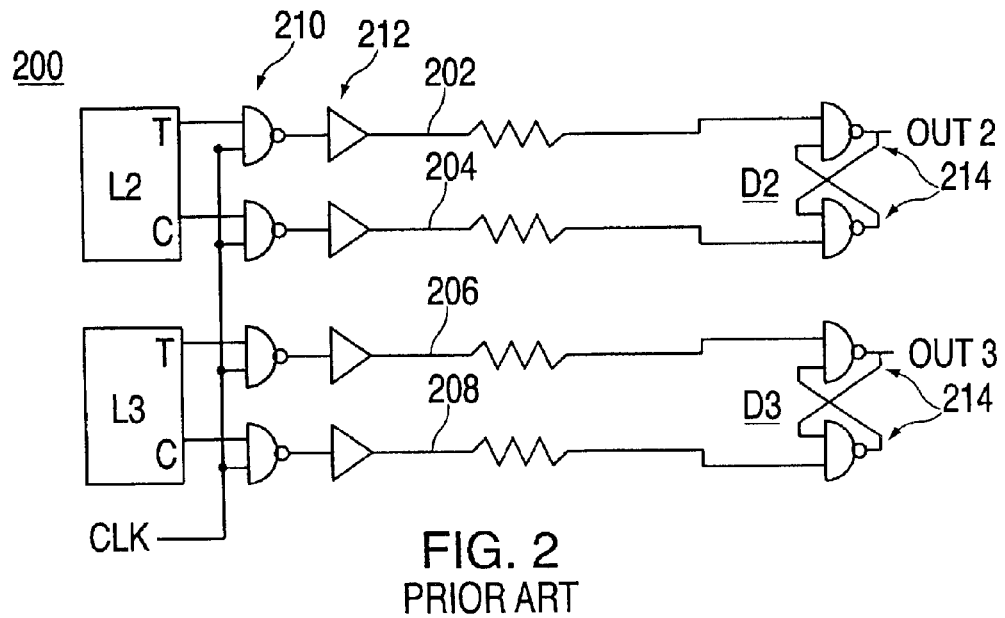
FIG. 2 is a schematic diagram of an existing, double ended true/complement data bus for another pair of data bits.

In contrast, FIG. 2 is a schematic diagram of an existing true/complement data bus system 200 featuring another pair of transmitting data latches L2, L3, each coupled by a pair of data lines to corresponding data receive latches, D2, D3. In this double ended, true/complement configuration, both the true and complement nodes of latches L2, L3 are coupled to latches D2, D3 through a total of four data lines, 202, 204, 206 and 208. FIG. 2 also illustrates the use of clock signal CLK to trigger the data transmit operation of the true and complement nodes by NAND gates 210 and buffers 212. In addition, the receive latches D2, D3 are S-R (SET/RESET) latches depicted schematically by a pair of cross-coupled NAND gates 214, as will be recognized by one skilled in the art. Furthermore, although a ground precharge, $V_{dd}$ active system is presumed in FIG. 2, it will be appreciated that a $V_{dd}$ precharge, ground active design could be used as well.

The true/complement system 200 of FIG. 2 illustrates how the true and complement data bit pairs are used to directly control the set and reset of the capture latch. Specifically, the data transitions either on the true or complement leg act to directly set or reset the latch. In this scheme, each data bit self-times its respective data receive latch, thereby removing the need for clock generation and data setup to clock. Whereas the single ended static system 100 requires that a high to low transition and a low to high transition be equally as fast, the true/complement system 200 only requires that one of the two transition types to be quick (since only one transition is in the access path, while the other is in the restore path). This in turn allows for optimization of the "forward path" at the expense of the "reverse path", leading to smaller device area for the restore devices and faster operation of the forward path.

As stated previously, however, the true/complement system 200 of FIG. 2 also consumes twice the power of the single ended, static system 100 of FIG. 1. Therefore, in accordance with an embodiment of the invention, there is disclosed a self-timed, decoded data path system in which at least two data bits are "grouped" by encoding logic such that the transmission of data therefrom results on only one data line being discharged during a given clock cycle.

Figures 3, 4:
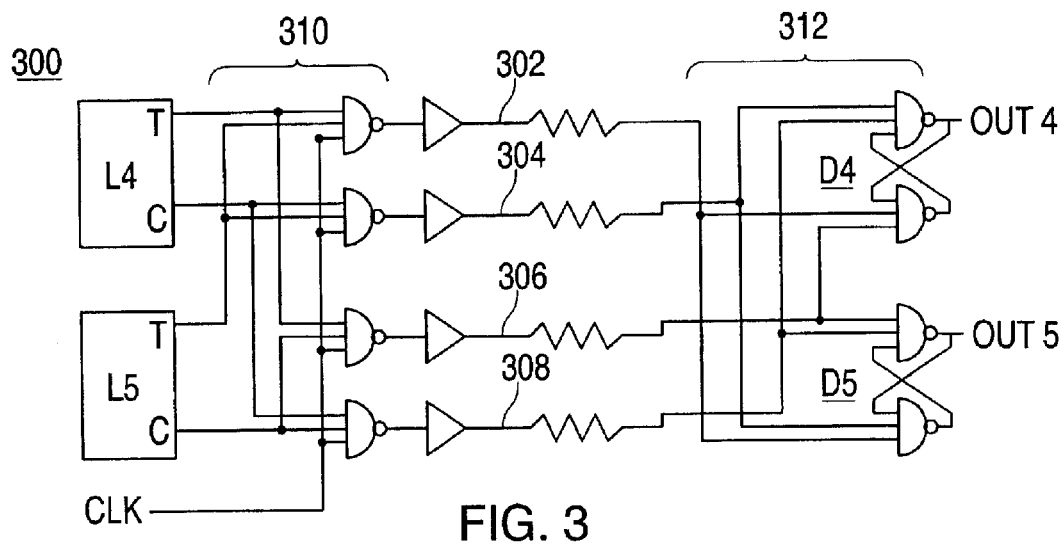
FIG. 3 is a schematic diagram of a grouped, encoded data path lay-out for a pair of data bits, in accordance with an embodiment of the invention.
FIG. 4 is a truth table illustrating the operation of the encoding/decoding logic of the self-timed data bus system depicted in the embodiment of FIG. 3.

Referring now to FIG. 3, there is shown a schematic diagram of one possible embodiment of the self-timed, decoded data path system 300. For purposes of comparison, FIG. 3 also illustrates the transmission of data between a pair of data transmission latches L4, L5 and a corresponding pair of data receiving latches D4, D5, over data lines 302, 304, 306, 308. As was the case in FIG. 2, the data receiving latches. D4, D5 are depicted as S-R latches. In order to reduce consumed power, the data bit information for both L4 and L5 is grouped together for transmission purposes by encoding logic 310 and decoding logic 312. In other words, instead of two independent data bits each having a pair of data lines associated therewith, the data bit information originating from L4 and L5 is encoded and transmitted using a set of four data lines.

The encoding of the data is implemented through encoding logic 310 such that only one of the four lines 302, 304, 306 and 308 will "fire" (e.g., be discharged to ground) during a transmission cycle, regardless of the particular value of the true data bits for L4 and L5. Correspondingly, the discharge to ground of one of the four lines 302, 304, 306 and 308, combined with decoding logic 312, will cause either a SET or a RESET operation in D4 and D5 so as to store the properly decoded data bits therein. It should be understood that the encoding/decoding logic shown in FIG. 3 is only an exemplary logical representation of the operations carried out by the system, and not necessarily the actual circuits used. One skilled in the art will recognize that the actual logic functions may be carried out by any number of possible logic gate configurations. Moreover, the design of the latches and data drive buffers may be optimized for each specific implementation to provide the best performance.

The added delay of any AND/OR gates associated with the logic can be almost completely removed from the system with proper design. For example, an AND/NAND gate may be integrated into a buffer design such that the total delay is very close or identical to the single input buffer of the T/C system. Also, with regard to the capture latches, providing two parallel SET inputs and two parallel RESET inputs (as shown schematically in FIG. 3) can remove the need for any OR logic that would otherwise slow down the data path. For designs that have multiple drive locations on a single bus, converting the buffer logic to tri-state buffer logic will allow for "dotting" multiple decode drivers on a single decode bus. Many T/C data latches for memories utilize precharge logic that holds both the true and complement latch outputs at the same state (ground precharge for example). This third data state can be used to tri-state the buffer.

FIG. 4 is a truth table that further illustrates the operation of the encoding logic 310 and decoding logic 312. As is shown, when the value of the data bits from L4 and L5 are both logic "0", only data line 308 will be discharged to ground upon the activation of the transmit clock, since only the NAND gate coupled to line 308 has its output at logic "0". At the decoding logic end, discharged data line 308 causes a SET operation at both D4 and D5, which results in the correct latching of a "0" bit in each. When L4 transmits a "1" and L5 transmits a "0", only data line 306 is discharged, causing a RESET operation and D4 and a SET operation at D5. When L4 transmits a "0" and L5 transmits a "1", only data line 304 is discharged, causing a SET operation at D4 and a RESET operation at D5. Lastly, whenever both L4 and L5 transmit a "1", only data line 302 is discharged, causing a RESET operation at both D4 and D5.

Figure 5:
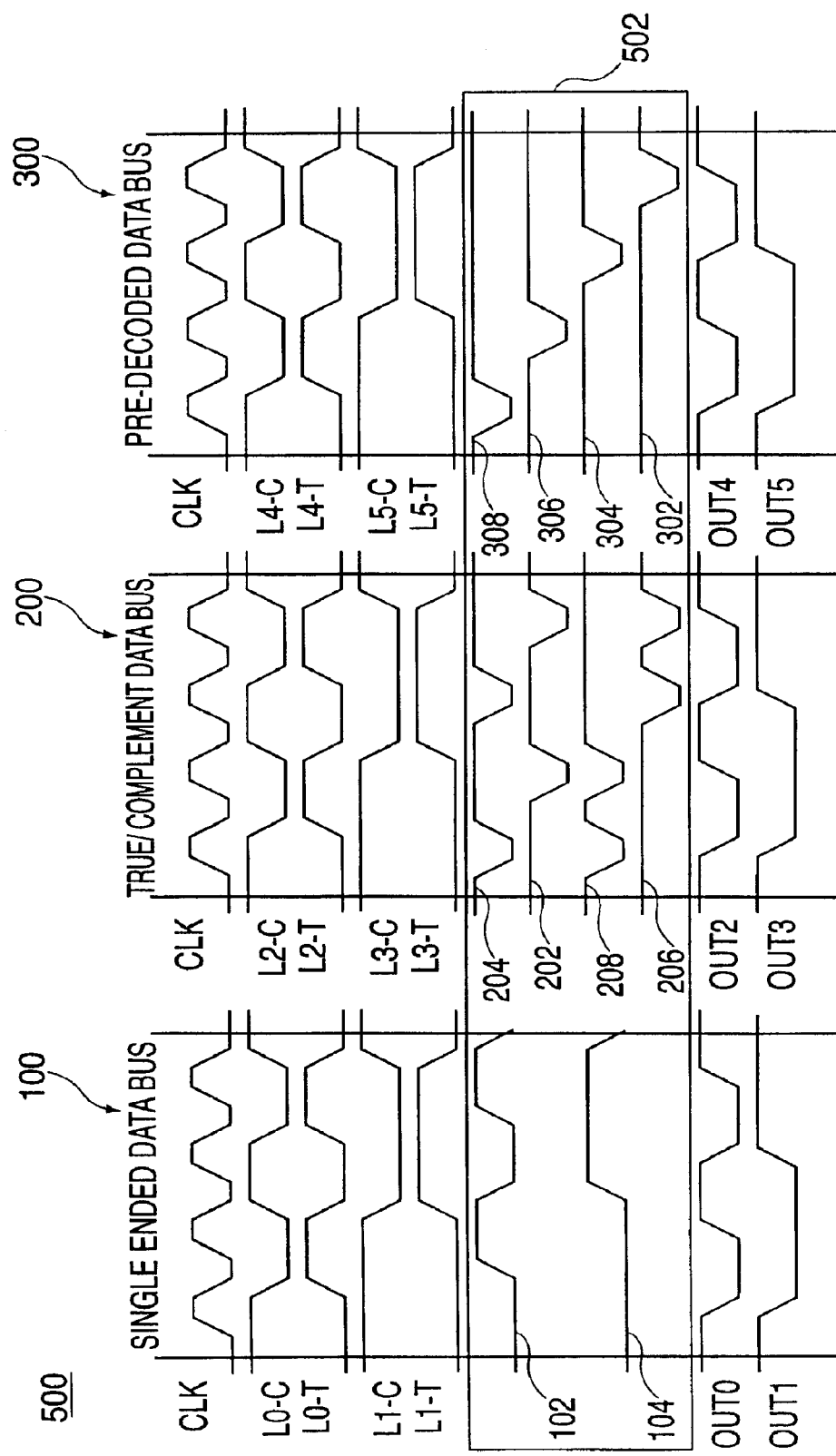
FIG. 5 is a timing diagram comparing the data transferring operations of the systems of FIGS. 1–3.

FIG. 5 is a timing diagram 500 that provides a comparison of the data transfer operation of each of the conventional schemes of FIGS. 1 and 2 with the present invention embodiment of FIG. 3. The top portion of the timing diagram 500 illustrates that the data transmitted from each pair of transmitting latches from the three respective systems is the same over four clock cycles for comparison purposes. The output data shown at the bottom of diagram 500 (i.e., the data received by the receiving latch pairs) is also the same for each system 100, 200, 300.

The difference between the data transmission and power consumption in the three systems is reflected in the highlighted portion 502 of the timing diagram 500. In the single ended system 100, the least amount of power is consumed as reflected by the transition in the potential on lines 102 and 104. Again, the primary disadvantage of this configuration is the reliance on the system clock to latch the captured data. In the true/complement system 200 (where all lines are precharged to high), it will be seen that during each clock cycle, one of the true or complement lines for both bits are always discharged.

More specifically, FIG. 5 shows that during the transmission of (0, 0) at the first clock cycle, complement lines 204 and 208 are discharged. At the second clock cycle, the transmission of (0, 1) results in true line 202 of L2 and complement line 208 of L3 being discharged; at the third clock cycle, the transmission of (1, 0) results in complement line 204 of L2 and true line 206 of L3 being discharged; and at the fourth clock cycle, the transmission of (1, 1) results in true lines 202 and 206 being discharged. In contrast, for the system 300 of the present disclosure, during the same four clock cycles, only one of the four total lines (302, 304, 306, 308) is discharged.

Although the embodiment of FIG. 3 depicts a system 300 in which two data bits are used in an encoded group, it will be appreciated that more than two data bits may also be grouped together in this manner. It therefore follows that the larger the grouping of the data bits, the less power is consumed. Table 1 below provides a comparison of data group size, associated wiring and power consumption.

TABLE 1

Data Group Size, Wiring, and Power Comparison

| Number of Data bits in Group | T/C Pairs | Decoded Lines | Power |
| --- | --- | --- | --- |
| 1 | 2 | 2 | 1X |
| 2 | 4 | 4 | 0.5X |
| 3 | 6 | 8 | 0.33X |
| 4 | 8 | 16 | 0.25X |

As can be seen from the above table, with no grouping of data bits per se (i.e., 1 bit per "group"), there are a total of two true/complement data lines, and thus two "decoded" lines used in the transmission of the data, as was described in FIG. 2. The power consumption associated with this configuration is normalized to a value of 1 (full power) for comparison purposes. If, however, a group of two data bits is created for transmission purposes, there are now four total data lines in the group (two true lines, and two complement lines). This is the embodiment depicted in FIG. 3. In order to encode a two-bit segment of data, wherein only one line represents each of the possible data combinations, a total of $2^2$, or four decoded lines are needed. Since there are a total of four lines already associated with two, true/complement pairs, no additional wiring is needed for carrying out the encoding/decoding function. As was also discussed earlier, the discharging of only one of four data lines represents a 50% power savings (equivalent power to the single ended system)If the group were to be expanded to include three bits, then only one of $2^3$, or eight decoding lines has to be discharged during the three-bit transmission. This would then represent a power consumption of only 33% with respect to the true/complement scheme. However, since a three-bit latch group only has a total of six T/C lines available, an additional two lines are needed for the encoding function. As a result, the issue of using additional chip real estate now comes into consideration. This becomes even more apparent as the group size is increased; an n-bit group requires $2^n$ decoding lines, but only 2n T/C lines are conventionally available.

Accordingly, because a group of two data lines uses the same amount of wiring as a true/complement system and uses only half of the power thereof, it is the preferred embodiment for a self-timing data path. Additional power savings by increasing the bit group size would then result in an exponential tradeoff in additional area needed for the decoding lines.

As will be appreciated, the above described self-timed, decoded data path configuration may be utilized in conjunction with a wide variety of applications such as address busses, content addressable memories (CAM), DRAM, SRAM, microprocessors, application specific integrated circuits (ASIC), etc. Many high-speed memories, for example, use true/complement address busses that are precharged at the end of each cycle. Thus, converting these address paths to decoded address paths versus straight T/C transmission can reduce power consumption while maintaining performance and self-timing.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A self-timed data transmission system, comprising:
   a data bit group defined by at least two data bits to be transmitted from a corresponding plurality of transmitting storage elements;
   a corresponding plurality of data receiving storage elements for receiving the data transmitted from said transmitting storage elements;
   encoding logic for encoding the transmitted data from said transmitting storage elements, wherein said encoded transmitted data is coupled to a plurality of data lines; and
   wherein said encoding logic is further configured so as to result in only one of said plurality of data lines being activated during a given data transmission cycle.

2. The system of claim 1, wherein said plurality of data lines further comprises a true line and a complementary line for each data bit within said data bit group.

3. The system of claim 2, wherein said data bit group comprises two data bits.

4. The system of claim 1, further comprising decoding logic for decoding the encoded transmitted data on said plurality of data lines, said decoding logic coupled to said data receiving storage elements.

5. The system of claim 1, wherein said plurality of data lines are precharged prior to a data transmission operation and said activating only one of said plurality of data lines a given data transmission cycle comprises discharging said only one of said plurality of data lines.

6. A self-timed, digital data input/output (I/O) path transmission system, comprising:
   a data bit group defined by at least two data bits to be transmitted from a corresponding plurality of transmitting latches;

a corresponding plurality of data receiving storage latches for receiving the data transmitted from said transmitting latches;

encoding logic for encoding the transmitted data from said transmitting latches, wherein said encoded transmitted data is coupled to a plurality of data lines;

decoding logic for decoding the encoded transmitted data on said plurality of data lines, said decoding logic coupled to said receiving latches;

wherein said encoding logic is further configured so as to result in only one of said plurality of data lines being activated during a given data transmission cycle.

7. The system of claim 6, wherein said plurality of data lines further comprises a true line and a complementary line for each data bit within said data bit group.

8. The system of claim 7, wherein said data bit group comprises two data bits.

9. The system of claim 6, wherein said receiving latches further comprise set/reset (S-R) latches.

10. The system of claim 9, wherein a logic 0 data bit is stored in a given receiving latch upon discharge of a set node associated therewith, and wherein a logic 1 data bit is stored in said given receiving latch upon discharge of a reset node associated therewith.

11. The system of claim 6, wherein said plurality of data lines are precharged prior to a data transmission operation and said activating only one of said plurality of data lines a given data transmission cycle comprises discharging said only one of said plurality of data lines.

12. The system of claim 11, wherein said encoding logic comprises a plurality of NAND gates, each of said NAND gates having one of a true/complement node from a first transmission latch as a first input thereto, and one of a true/complement node from a second transmission latch as a second input thereto.

13. The system of claim 12, wherein said only one of said plurality of data lines discharged during a given clock cycle corresponds to the data line coupled to the one of said NAND gates having logic 1 as first and second inputs thereto.

14. A method for transmitting self-timed data within a multiple input/output (I/O) data path, the method comprising:

configuring the data path into data bit groups defined by at least two data bits to be transmitted from a corresponding plurality of transmitting storage elements;

encoding the data from said transmitting storage elements and coupling said encoded onto a plurality of data lines; and decoding the data from said plurality of data lines, said decoded data thereafter received by a corresponding plurality of data receiving storage elements;

wherein said encoding the data is implemented in a manner so as to result in only one of said plurality of data lines being activated during a given data transmission cycle.

15. The method of claim 14, wherein said plurality of data lines further comprises a true line and a complementary line for each data bit within said data bit group.

16. The method of claim 15, wherein said data bit group comprises two data bits.

17. The method of claim 14, further comprising precharging said plurality of data lines prior to a data transmission operation and wherein said activating only one of said plurality of data lines a given data transmission cycle comprises discharging said only one of said plurality of data lines.

* * * * *